US010652992B2

(12) United States Patent
Xie et al.

(10) Patent No.: US 10,652,992 B2
(45) Date of Patent: May 12, 2020

(54) PRINTED CIRCUIT BOARD, METHOD FOR MANUFACTURING THE SAME AND ELECTRONIC DEVICE

(71) Applicant: SHENNAN CIRCUITS CO., LTD., Shenzhen (CN)

(72) Inventors: Zhanhao Xie, Shenzhen (CN); Hua Miao, Shenzhen (CN); Chuanzhi Li, Shenzhen (CN); Xudong Chen, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 0 days.

(21) Appl. No.: 16/264,713

(22) Filed: Feb. 1, 2019

(65) Prior Publication Data

US 2019/0254156 A1 Aug. 15, 2019

(30) Foreign Application Priority Data

Feb. 9, 2018 (CN) .......................... 2018 1 0136809
Sep. 5, 2018 (CN) ...................... 2018 2 1451259 U
(Continued)

(51) Int. Cl.
*H05K 1/02* (2006.01)
*H05K 3/46* (2006.01)
(Continued)

(52) U.S. Cl.
CPC ......... *H05K 1/0201* (2013.01); *H05K 1/0298* (2013.01); *H05K 1/115* (2013.01); *H05K 1/144* (2013.01); *H05K 3/4611* (2013.01)

(58) Field of Classification Search
CPC .. H05K 1/0201; H05K 1/0203; H05K 1/0204; H05K 1/0206; H05K 1/0207; H05K 1/0209; H05K 1/021
See application file for complete search history.

(56) References Cited

U.S. PATENT DOCUMENTS

2015/0243609 A1* 8/2015 Lamorey ............... H01L 23/642
 361/717
2017/0223817 A1 8/2017 Chen et al.

FOREIGN PATENT DOCUMENTS

CN 105142333 A 12/2015
CN 105744725 A 7/2016
(Continued)

OTHER PUBLICATIONS

The First Office Action for related TW Application No.108103936 dated Dec. 26, 2019; (5 pages).

*Primary Examiner* — Jeremy C Norris

(57) ABSTRACT

The present disclosure discloses a printed circuit board, a method for manufacturing the same and an electronic device. The PCB includes: a core board assembly including a first core board and a second core board which are stacked together, wherein the second core board includes a metal layer formed on a side of the second core board oriented towards the first core board, and the first core board defines a through slot extending through the first core board; a radiator, disposed in the through slot; and a conductive adhering layer, disposed between the metal layer of the second core board and the radiator, wherein the conductive adhering layer is configured to electrically connect the radiator and the metal layer. The present disclosure connects the radiator directly with the metal layer. The implementation of the present disclosure may help cooling the metal layer to improve the cooling performance of the PCB.

27 Claims, 8 Drawing Sheets

(30) Foreign Application Priority Data

Sep. 5, 2018 (CN) .................... 2018 2 1451331 U
Sep. 5, 2018 (CN) .................... 2018 2 1451333 U
Sep. 5, 2018 (CN) .................... 2018 2 1451362 U
Sep. 5, 2018 (CN) .................... 2018 2 1451561 U
Sep. 5, 2018 (CN) .................... 2018 2 1455593 U
Sep. 5, 2018 (CN) .................... 2018 2 1458559 U
Sep. 5, 2018 (CN) .................... 2018 2 1458560 U

(51) Int. Cl.
*H05K 1/14* (2006.01)
*H05K 1/11* (2006.01)

(56) References Cited

FOREIGN PATENT DOCUMENTS

| | | |
|---|---|---|
| CN | 106163081 A | 11/2016 |
| CN | 107079582 A | 8/2017 |
| TW | 201019810 A | 5/2010 |
| TW | 201737436 A | 10/2017 |
| TW | M583683 U | 9/2019 |

* cited by examiner

PRINTED CIRCUIT BOARD, METHOD FOR MANUFACTURING THE SAME AND ELECTRONIC DEVICE

CROSS-REFERENCE TO RELATED APPLICATIONS

The present application claims foreign priority of Chinese Patent Applications No. 201810136809.5, filed on Feb. 9, 2018, No. 201821451259.8, filed on Sep. 5, 2018, No. 201821455593.0, filed on Sep. 5, 2018, No. 201821451331.7, filed on Sep. 5, 2018, No. 201821458559.9, filed on Sep. 5, 2018, No. 201821458560.1, filed on Sep. 5, 2018, No. 201821451333.6, filed on Sep. 5, 2018, No. 201821451561.3, filed on Sep. 5, 2018, and No. 201821451362.2, filed on Sep. 5, 2015, in the National Intellectual Property Administration of China, the contents of all of which are hereby incorporated by reference.

TECHNICAL FIELD

The present disclosure generally relates to integrated circuit field, and in particular to a printed circuit board, a method for manufacturing the same and an electronic device.

BACKGROUND

The printed circuit board (PCB) is an important electronic device. It is one of the most important components in the electronic industry. The PCB is utilized in almost all kinds of electronic devices, for example, electronic watch, calculator, computer, communication electronic device, military weapon system etc., for electrically connecting the electronic components (e.g., integrated circuit) thereof. Thus, the PCB plays a more and more important role in the circuit technique field. Now the size of the electronic device has become smaller and smaller, and the function of the electronic deuce has been unproved. Since more electronic components are installed in a small space, heat emitting of the circuit may increase. Therefore, it is necessary to find a solution to solve the cooling problem of the circuit.

SUMMARY

Accordingly, the present disclosure aims to provide a printed circuit board, a method for manufacturing the same and an electronic device so as to solve the cooling problem of the electronic device.

To solve the above mentioned problem, a technical scheme adopted by the present disclosure is to provide a printed circuit board (PCB). The PCB includes: a core board assembly comprising a first core board and a second core board which are stacked together, wherein the second core board comprises a metal layer formed on a side of the second core board towards the first core board, and the first core board defines a through slot extending through the first core board; a radiator, at least partially disposed in the through slot; and a conductive adhering layer, disposed between the metal layer of the second core board and the radiator, wherein the conductive adhering layer is configured to electrically connect the radiator and the metal layer.

To solve the above mentioned problem, another technical scheme adopted by the present disclosure is to provide an electronic device. The electronic device includes: a core board assembly comprising a first core board and a second core board successively disposed together, wherein the second core board comprises a grounding layer formed on a side of the second core board towards the first core board, and the first core board defines a through slot; a radiator disposed in the through slot; and a conductive adhering layer disposed between the grounding layer and the first radiator and configured to stick the radiator on the metal layer.

To solve the above mentioned problem, another technical scheme adopted by the present disclosure is: providing a first core board, a second core board, a radiator and conductive adhering material, wherein the second core board comprises a metal layer disposed on a side of the second core board; slotting the first core board to from a first through slot extending through the first core board; covering at least a portion of a surface of the radiator or a portion of a surface of the metal layer with the conductive adhering material; placing the radiator in the first through slot so as to stick the radiator on the metal layer; and compressing the first core board, the second core board, the radiator and the conductive adhering material to form the PCB.

According to the embodiments of the present disclosure, a slot is defined on the core board assembly. A radiator is disposed in the slot. The conductive adhering layer is utilized to physically and electrically connect the first radiator and the metal layer of the second core board. Thus, the grounding performance of electronic components arranged on the PCB may be enhanced, as well as their cooling performance. Therefore, the implementation of the present disclosure may improve the cooling performance of the PCB.

BRIEF DESCRIPTION OF THE DRAWINGS

In order to clearly explain the technical solutions in the embodiments of the present disclosure, the drawings used in the description of the embodiments will be briefly described below. Obviously, the drawings in the following description are merely some embodiments of the present disclosure. For those of ordinary skill in the art, other drawings may also be obtained based on these drawings without any creative work.

REFERENCE NUMBERS OF MAIN COMPONENTS

Figure 1:
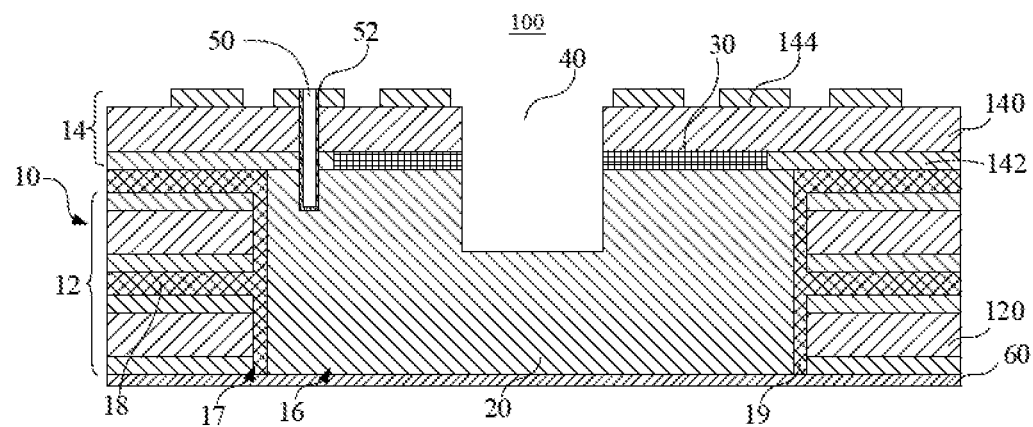
FIG. 1 is a section view of a printed circuit board according to an embodiment of the present disclosure.

| | |
|---|---|
| Printed circuit board | 100 |
| Core board assembly | 10 |
| Radiator | 20 |
| Conductive adhering layer | 30 |
| First core board | 12 |
| Second core board | 14 |
| Substrate | 120 |
| Metal layer | 122 |
| Substrate | 140 |
| Grounding layer | 142 |
| Signal layer | 144 |
| Slot | 16 |
| First connecting layer | 18 |
| Second connecting layer | 19 |
| Installation slot | 40 |
| Via hole | 50 |
| Conductive layer | 52 |
| Electronic device | 300 |
| Heating component | 200 |
| First radiator | 20a |
| Electronic component | 210 |
| Second radiator | 220 |
| Metal cover | 60 |
| Conductive soldering material layer | 80 |

DETAILED DESCRIPTION

The disclosure will now be described in detail with reference to the accompanying drawings and examples. Apparently, the described embodiments are only a part of the embodiments of the present disclosure, not all of the embodiments. All other embodiments obtained by a person of ordinary skill in the art based on the embodiments of the present invention without creative efforts shall fall within the protection scope of the present invention.

The terms "first" and "second" in this application are used for descriptive purposes only and are not to be construed as indicating or implying relative importance or implying the number of indicated technical features. Thus, features defined as "first", "second" may explicitly or implicitly include at least one such feature. In the description of the present application, the meaning of "plurality" is at least two, such as two, three, etc., unless specifically and specifically defined otherwise. All directional indications (such as up, down, left, right, front, rear, etc.) in the embodiments of the present application are only used to explain the relative positional relationship between the elements in a certain posture (as shown in the drawings), sports situations, etc. If the specific posture changes, the directionality indication also changes accordingly. Further, the terms "include" and "have" and any variants thereof are intended to cover non-exclusive inclusions. For example, a process, method, system, product, or device that comprises a series of steps or elements is not limited to the listed steps or elements, but may optionally include steps or elements that are not listed, or alternatively may include other steps or elements inherent these processes, methods, products, or devices.

In the description of this application, it should be noted that the terms "install", "be connected with", "connect to", and "set on" should be interpreted broadly unless explicitly stated or defined otherwise. For example, it may be a fixed connection, a detachable connection, or an integral connection. It may be a mechanical connection. It may be a direct connection, or it may be indirectly connected through an intermediary medium, and may be the internal communication of two elements. Those of ordinary skill in the art can understand the specific meanings of the above terms in the present application as the case may be.

In the description of the present application, the meaning of "plurality" is two or more unless otherwise specified. In the present specification, the term "process" is used herein to refer not only to an independent process but also to the term insofar as it cannot be clearly distinguished from other processes as long as the intended effect of the process can be achieved. In addition, the numerical range represented with "-" or "to" in this specification means the range which includes the numerical value described before and after "-" or "to" as a minimum value and the maximum value, respectively. In the drawings, structurally similar or identical elements are denoted by the same reference numerals.

In addition, in the description of the present application, the electronic device may include one of the smart phone, tablet personal computer, mobile phone, video phone, e-book reader, desktop computer, laptop, netbook computer, workstation, server, personal digital assistant, portable multimedia player, player, medical instrument, camera, and wearable device. The wearable device may include the accessories (e.g., watches, rings, bracelets, anklets, eyeglasses, contact lenses, or head-mounted devices), clothing integrated type (e.g., electronic clothes), body attached type (e.g., skin pads or tattoos), or implantable type (e.g., implantable circuits). In some embodiments, the home appliance may include, for example, a digital versatile disk player, audio, refrigerator, air conditioner, cleaner, oven, microwave oven, washing machine, air filter, set top box, home automation control panel, security control panel, TV box, game console, electronic dictionary, electronic keys, video camera or electronic panel etc.

The electronic device may also include at least one of various medical devices (such as various portable medical measuring devices (glucose meters, heart rate measuring devices, blood pressure measuring devices, and body temperature measuring devices), magnetic resonance angiographies, magnetic resonance imaging devices, computed tomography devices, photography devices and ultrasonic devices), navigation systems, global navigation satellite systems, event data recorders, flight data recorders, vehicle infotainment devices, electronic devices for ships (e.g., navigation devices for ships and gyro compasses), aviation electronic devices, security devices, vehicle head units, industrial or home robots, automated teller machines of financial companies, store point-of-sales and internet of things (e.g., bulbs, various sensors, electricity or gas meters, sprinkler devices, fire alarms, thermostats, utility poles, toasters, sport devices, hot water tanks, heaters, and boilers. According to various embodiments of the present disclosure, the electronic device may include a piece of furniture or a building/structure or a part of a vehicle, an electronic board, an electronic signature receiving device, a projector, or various measuring devices such as water service, electric energy, gas or electric wave measurement device). In various embodiments of the present application, the electronic device may be flexible, or the electronic device may be two or more combinations of various devices. The electronic device according to the embodiment of the present application is not limited to the above device.

References herein to "an embodiment" means that a particular feature, structure, or characteristic described in connection with an embodiment can be included in at least one embodiment of the present application. The appearances of such phrases in various places in the specification are not necessarily all referring to the same embodiment, nor are separate or alternative embodiments mutually exclusive of other embodiments. It will be understood by those skilled in the art, both explicitly and implicitly, that the embodiments described herein can be combined with other embodiments.

Referring to FIG. 1, FIG. 1 is a section view of the printed circuit board according to an embodiment of the present disclosure.

As shown in FIG. 1, in this embodiment, the printed circuit board 100 may include a core board assembly 10, a radiator 20 and a conductive adhering layer 30. The radiator 20 and the conductive adhering layer 30 may be embedded in the core board assembly 10. The radiator 20 may be connected to the core board assembly 10 through the conductive adhering layer 30.

In one embodiment, the core board assembly 10 may include a first core board 12 and a second core board 14 which are stacked together in series.

As shown in FIG. 1, in this embodiment, the first core board 12 may include a substrate 120 and a metal layer set on at least one side of the substrate 120.

Similarly, the second core board 14 may include a substrate 140 and a grounding layer 142 set on at least one side of the substrate 140.

The material of the substrates 120 and 140 may be designed based on the functions of the core boards. The substrates 120 and 140 may be made of material with a low damping factor which is suitable for RF circuits, e.g., ceramic-based high frequency material or Teflon. Alternatively, the substrates 120 and 140 may be made of material with a high damping factor which is suitable for conventional circuits, e.g., FR-4 (including epikote).

In this embodiment, except for materials allowing RF signals with a certain frequency to pass, the substrates 120 and 140 may alternatively be made of thermosetting material. The substrates 120 and 140 may be pre-heated to be cured such that their shapes may be fixed. In subsequent heating processes, the shape of the substrates 120 and 140 will not be changed. Alternatively, the substrates may be thermoplastic material which is soften after being heated.

A thermosetting material can be soften and changed into liquid when heated the first time. When the heating temperature reaches a certain level, the cross-linking reaction may happen such that the material is cured and hardened. This transform is irreversible. This is to say, when heated again, the material will not be softened nor changed into liquid.

Common thermosetting materials may include (but is not limited to) allyl resin, epoxy resin, thermosetting polyurethane, silicone or polysiloxane etc. These resins may be formed from the reaction product of a polymerizable composition that includes at least one oligomeric polyurethane (meth) acrylate. In general, the oligomeric polyurethane (meth) acrylate is a poly (meth) acrylate. The term "(meth) acrylate" may refer to the esters of acrylic acid and methacrylic acid. Compared to "multi-(meth)-acrylates," which generally refer to (meth) acrylate polymers, "multi-(meth)-acrylate" refers to a molecule that includes more than one (meth) acrylate group. Usually, the multi-(meth)-acrylate may be a di-(meth)-acrylate, but tri-(meth)-acrylates, tetra-(meth)-acrylates, and the like are also contemplated.

In one embodiment, the grounding layer 142 may be disposed on a side of the first core board 12 oriented towards the second core board 14.

In this embodiment, the metal layers of the first core board 12 and the second core board 14 may be a layer of copper. The copper has good electrical conductivity and is the commonly used material for the printed circuit board 100. The circuit pattern may be acquired by patterning the first core board 12 and the second core board 14. Based on function design, the metal layers may be respectively set as a signal layer and a grounding layer. Normally the signal layer has a more complex pattern compared with the grounding layer. The signal layer may include metal wires for electrically connecting the components. The grounding layer may be grounded, and is usually composed by continuous metal layer.

In one embodiment, the grounding layer 142 of the second core board 14 which is connected to the radiator 20 through the conductive adhering layer 30 may be the grounding layer 142. Thus the radiator 20 and the grounding layer 142 of the second core board 14 may be indirectly and electrically connected. In this way, the grounding layer 142 may be electrically connected to the radiator 20 in this sandwich structure, which may shorten the path for grounding. Thus, the grounding performance of the grounding layer 142 and/or electronic components installed on the PCB 100 may be improved, as well as the grounding stability.

In one embodiment, referring to FIG. 1, the grounding layer 142 may be arranged on both sides of the substrate 140 of the second core board 14. The grounding layer 142 located on one side of the second core board 14 towards the first core board 12 may be the grounding layer 142, while the metal layer located on the other side which is opposite to the first core board 12 may be the first signal layer 144.

There may be multiple first core boards 12. The first core boards 12 may be successively stacked together. For example, in the embodiment shown in FIG. 1 there are two first core boards 12. Similarly, in other embodiments, there may be multiple second core board 14.

In one embodiment, the core board assembly 10 may further include at least one third core board. The at least one third core board may be disposed on the side of the second core board 14 which is opposite to the first core board 12. Each of the third core boards may include a substrate and a metal layer which is arranged on at least one side of the substrate.

In one embodiment, in the case that there are multiple third core boards, one of the third core bards which is most distanced from the second core board 14 may include a metal layer as the second signal layer on a side opposite to the second core board 14, i.e., the metal layer located oil the outside of the outer third core board may be a signal layer.

In the embodiment shown in FIG. 1, the core board assembly 10 may include two first core boards 12 and one second core board 14. The order in which the elements are stacked may be as follows: one of the first core boards 12, the other one of the first core boards 12, and the second core board 14, which refers to a layered and sandwiched structure.

Referring to FIG. 1, in this embodiment, the core board assembly 10 may define a slot 16, which is utilized to accommodate the radiator 20 and the conductive adhering layer 30. The slot 16 may extend through the first core board 12 along the thickness direction of the first core board 12 but not into any part of the second core board 14. That is, the slot 16 passes through the first core board 12 and extends up to the second core board 14.

Figure 8:
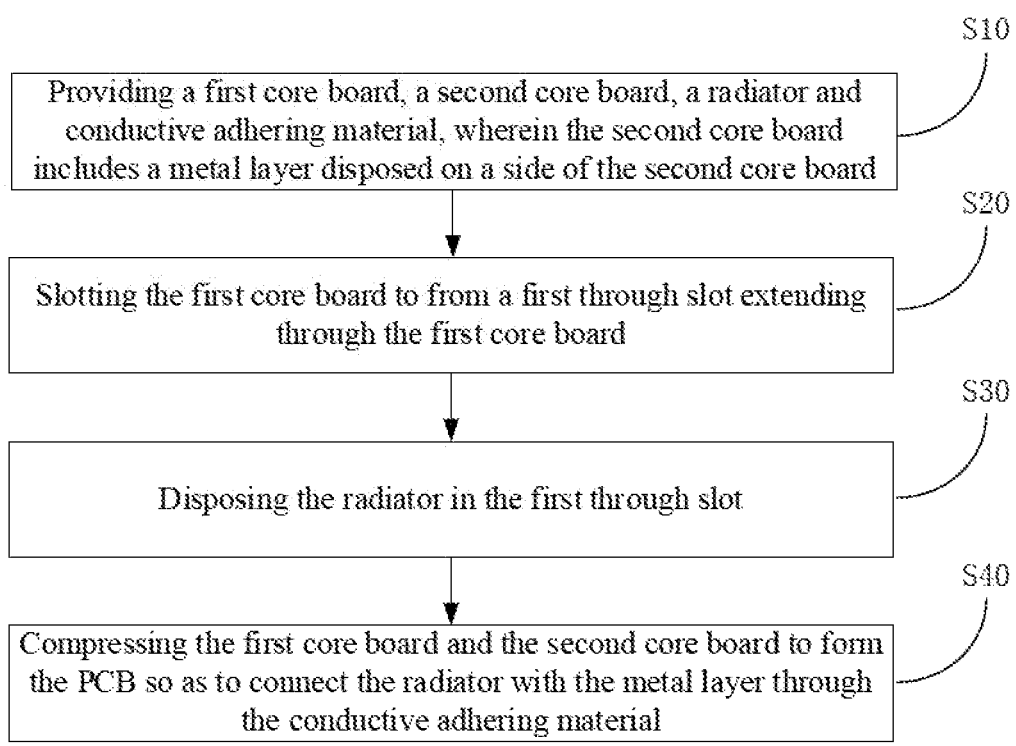
FIG. 8 is a flow chart of method for manufacturing the printed circuit board according to an embodiment of the present disclosure.
Figure 9:
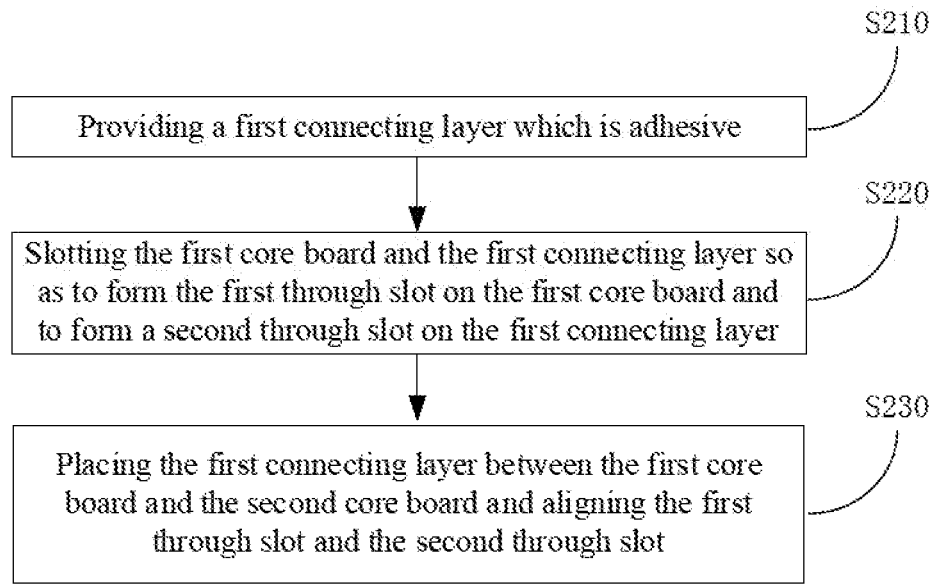
FIG. 9 is a flow chart of step S20 in FIG. 8 according to an embodiment of the present disclosure.
Figure 10:
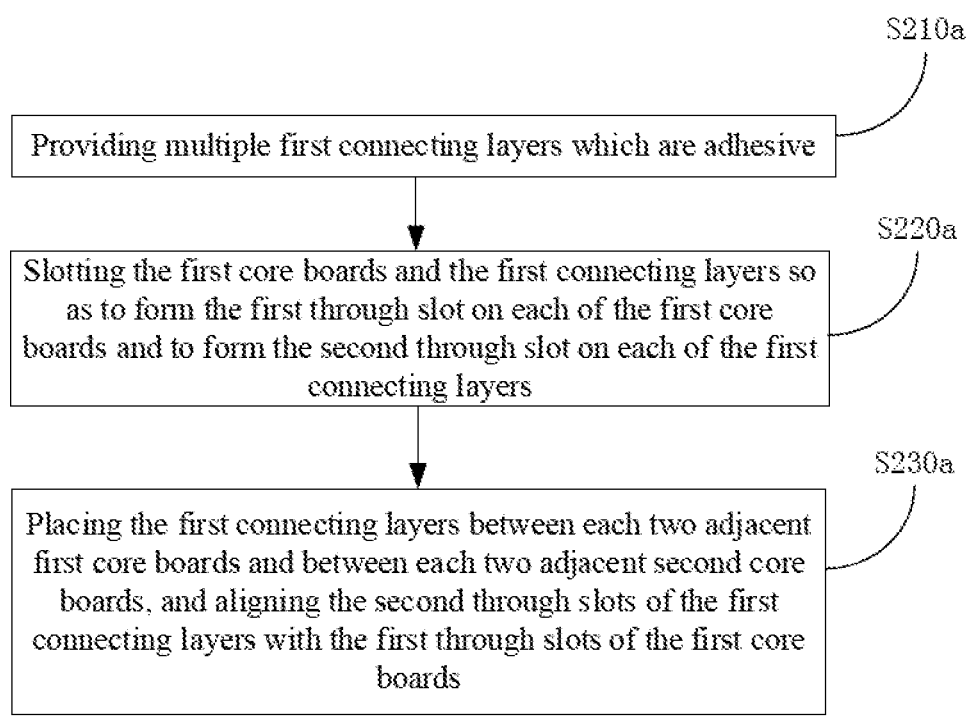
FIG. 10 is a flow chart of step S20 in FIG. 8 according to another embodiment of the present disclosure.
Figure 11:
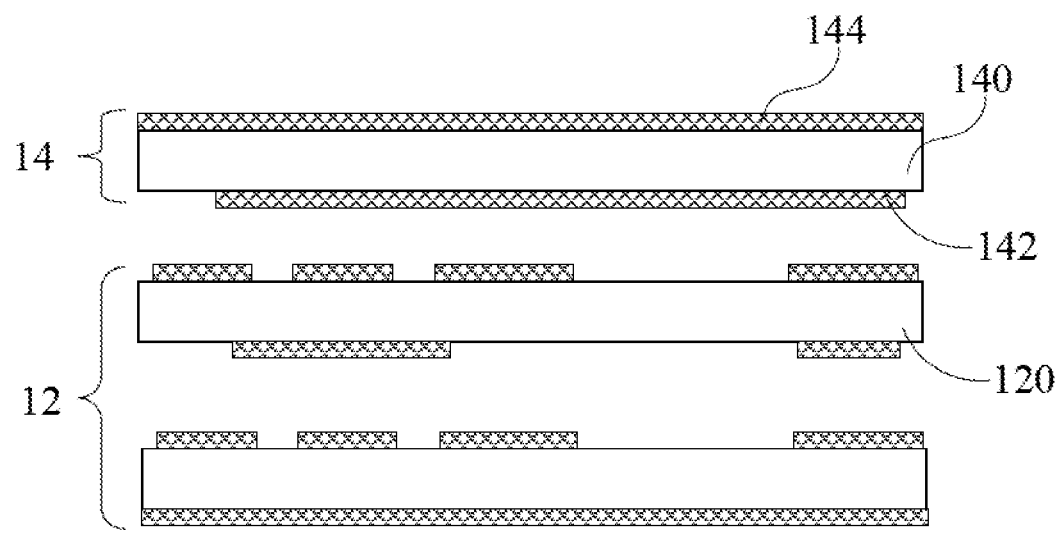
FIG. 11 shows a first core board and a second core board corresponding to step S10 in FIG. 8 according to an embodiment of the present disclosure.
Figure 12:
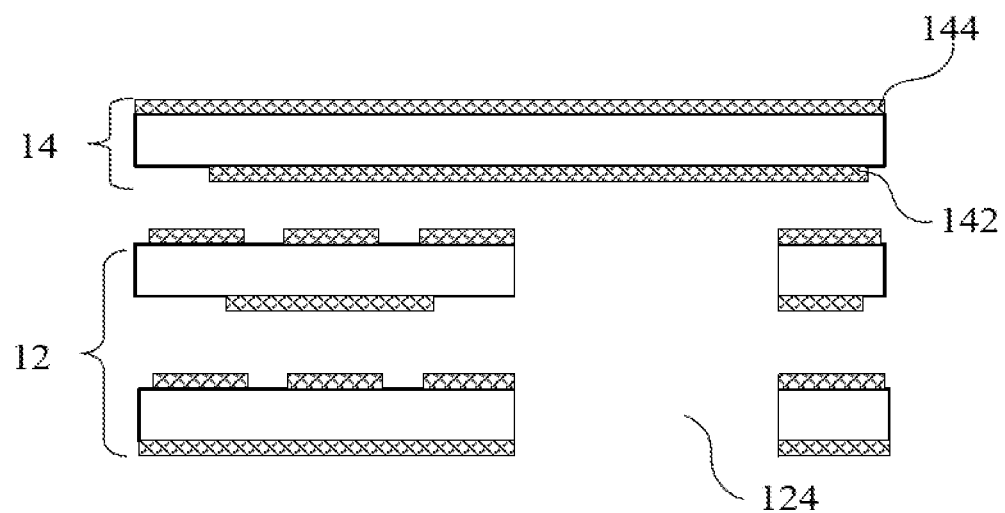
FIG. 12 shows forming a first through slot extending through the first core board in FIG. 11, corresponding to step S20 in FIG. 8 according to an embodiment of the present disclosure.
Figure 13:
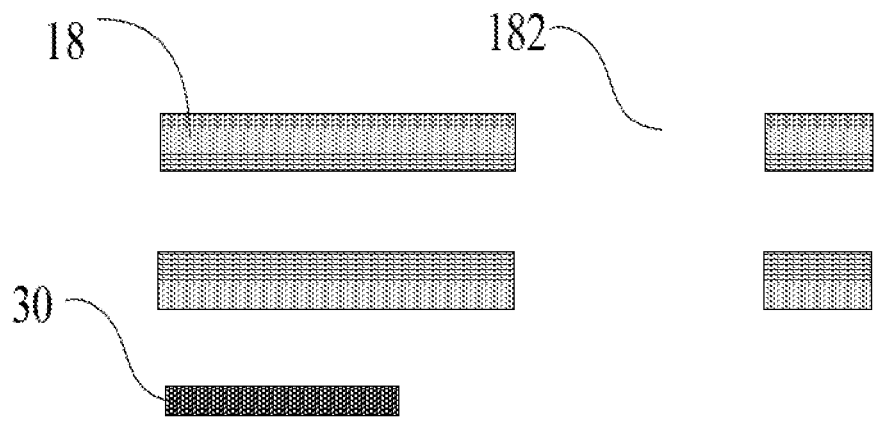
FIG. 13 shows forming a second through slot on a first connecting layer corresponding to step S220 in FIG. 9 according to an embodiment of the present disclosure.
Figure 14:
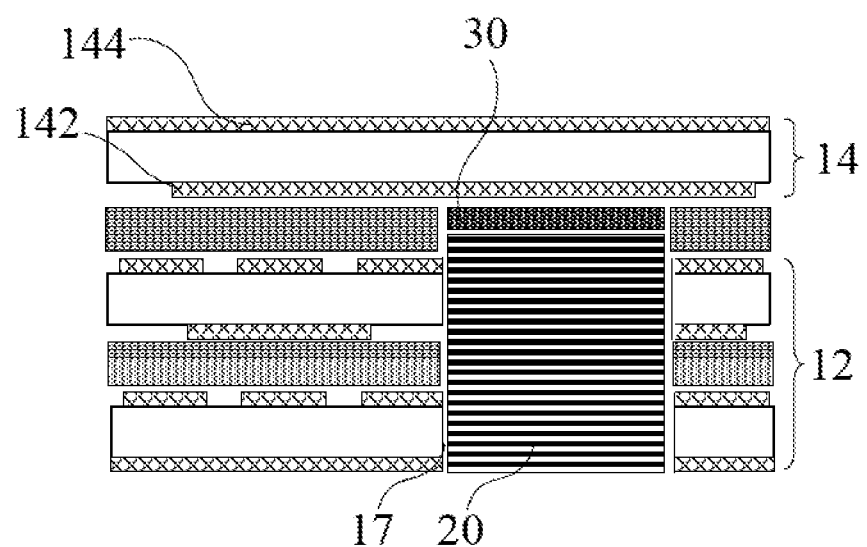
FIG. 14 shows disposing a radiator in the first through slot corresponding to step S30 in FIG. 8 according to an embodiment of the present disclosure.
Figure 15:
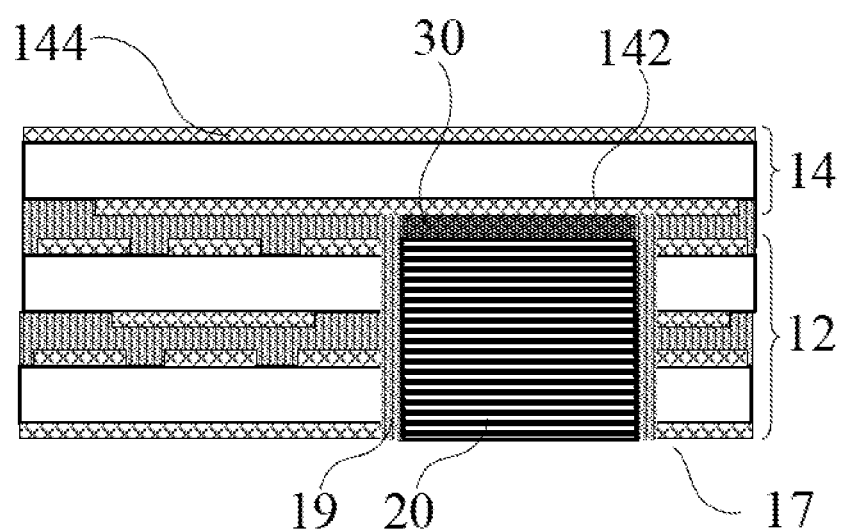
FIG. 15 shows compressing the first core board and the second core board to form the PCB so as to connect the radiator with the metal layer through the conductive adhering material corresponding to step S40 in FIG. 8 according to an embodiment of the present disclosure.

In this embodiment, each of the first core boards 12 may define a through slot 124 (as shown in FIG. 8). When the first core boards 12 and the second core board 14 are stacked together, the through slots 124 of the first core boards 12 are aligned. The slot formed by these through slots 124 extends up to the grounding layer 142 of the second core board 14 so as to provide the slot 16 for receiving the radiator 20. Thus at least part of the radiator 20 may be received in the slot 16.

As shown in FIG. 1, in this embodiment, the printed circuit board 100 may further include a first connecting layer 18. The first connecting layer 18 may be disposed between the first core board 12 and the second core board 14, and surrounding the conductive adhering layer 30. It is utilized to stick the first core board 12 on the second core board 14. Furthermore, when there are multiple first core boards 12 and second core boards 14, the first connecting layers 18 may also be arranged between each two adjacent first core boards 12 and between each two adjacent second core boards 14 so as to glue together the multiple core boards 12 and 14 of the core board assembly 10.

In this embodiment, the first connecting layer 18 may be made of adhesive material, specifically thermosetting material. The difference between the first connecting layer 18 and the substrate 120/140 is that the first connecting layer 18 may be made of thermosetting material which has not undergone heat treatment. Accordingly, when heated, the first connecting 18 may melt and then it can glue together each two adjacent first core boards 12, each two adjacent second core boards 14, and the first core board 12 and the second core board 14 located adjacent to each other.

In other embodiments, the first connecting layer 18 may be made of thermoplastic material. A thermoplastic material may be softened when heated and hardened when cooled, and the change is reversible and can be repeated. Common thermoplastic materials may include (but are not limited to) polyethylene, polypropylene, polyvinyl chloride, polystyrene, polyoxymethylene, polycarbonate, polyamide, acrylic plastics, other polyene ingress and copolymers, polyacryl, polyphenylene ether, chlorinated polyether etc. in thermoplastics, the molecular chains of the resin are linear or branched, and no chemical bonds are generated between the molecular chains. Thus the thermoplastics can be softened and become liquid when heated. The hardening of the thermoplastics during cooling is a physical change process.

In one embodiment, the thermoplastic material may include polyketone, polyaramid, polyimide, polyetherimide, polyamideimide, polyphenylene sulfide, polyphenylsulfone, fluoropolymer, polybenzimidazole, derivatives thereof or combination thereof.

In another embodiment, the thermoplastic material may include one polymer such as polyketone, thermoplastic polyimide, polyetherimide, polyphenylene sulfide, polyether sulfone, polysulfone, polyamide imide, derivatives thereof, or combinations thereof.

In yet another embodiment, the thermoplastic material may include polyetone such as polyether ether ketones, polyether ketones, polyether ketone ketones, polyether ether ketone ketones, derivatives thereof, or combinations thereof. One example of the thermoplastic fluoropolymer may include fluorinated ethylene propylene, polytetrafluoroethylene, polyvinylidene fluoride, perfluoroalkoxy, tetrafluoroethylene, hexafluoropropylene, and tripolymer of vinylidene fluoride, polychloro trifluoroethylene, ethylene-tetrafluoroethylene copolymer, ethylene-chlorotrifluoroethylene copolymer, or any combination thereof.

In this embodiment, the maximal cross-sectional area of the slot 16 may be greater than the maximal cross-sectional area of the radiator 20. When the radiator 20 is disposed in the slot 16, a gap 17 may be formed between the outer wall of the radiator 20 and the inner wall of the through slot(s) of the first core boards 12 that forms the slot 16. The maximal cross-sectional area of the slot 16 is the maximal projective area of the slot 16 in the direction substantially perpendicular to the extending direction of the first core board 12 and the second core board 14. The maximal cross-sectional area of the radiator 20 is the maximal area of the cross sections of the radiator 20 parallel to the first core board 12 and the second core board 14.

The shape of the radiator 20 may correspond to that of the slot 16. The radiator 20 may be at least partially disposed in the slot 16. That is, the radiator 20 may be received either partially or completely in the slot 16. The radiator 20 may be utilized for cooling those heating components set on the PCB 100.

For example, the length of the radiator 20 along the stacking direction of the first core board 12 and the second core board 14 may be larger than the depth of the slot 16. In this circumstance, the radiator 20 may extend beyond the outer side of the first core board 12 which is away from the first core board 12.

In this embodiment, the length of the radiator along the stacking direction of the first core board 12 and the second core board 14 may be substantially equal to the depth of the slot 16. Thus, the radiator 20 may be completely received in the slot 16, which may reduce the volume of the PCB 100.

Specifically, the radiator 20 may be an electrically and thermally conductive device. It may be a metal block. The metal block may be completely or partially embedded in the slot 16. The radiator 20 may be electrically connected with the grounding layer 142 through the conductive adhering layer 30. Thus, the implementation of the radiator 20 may improve the grounding performance of electronic components set on the PCB 100 as well as their cooling performance.

In one embodiment, the metal block may be made of pure metal, including but not limited to copper, copper alloy, aluminum, aluminum alloy iron, iron alloy, nickel, nickel alloy, gold, gold alloy, silver, silver alloy, platinum, platinum alloy, chromium, chromium alloy, magnesium, magnesium alloy, tungsten; tungsten alloy, molybdenum, molybdenum alloy, lead, lead alloy, tin, tin alloy, indium, indium alloy, zinc and zinc alloy etc.

In another embodiment, the radiator 20 may be made of a metal matrix and a conductive graphite plate. The thermo resistance of the conductive graphite plate is smaller than that of conventional metal and alloy. Thus embedding the conductive graphite plate in the metal may improve the thermal conduction. The material of the radiator 20 is not limited in the present disclosure.

The radiator 20 may have a regular shape such as cube or cylinder, or have an irregular shape. The structure of the radiator 20 is not limited in the present disclosure.

Figure 2:
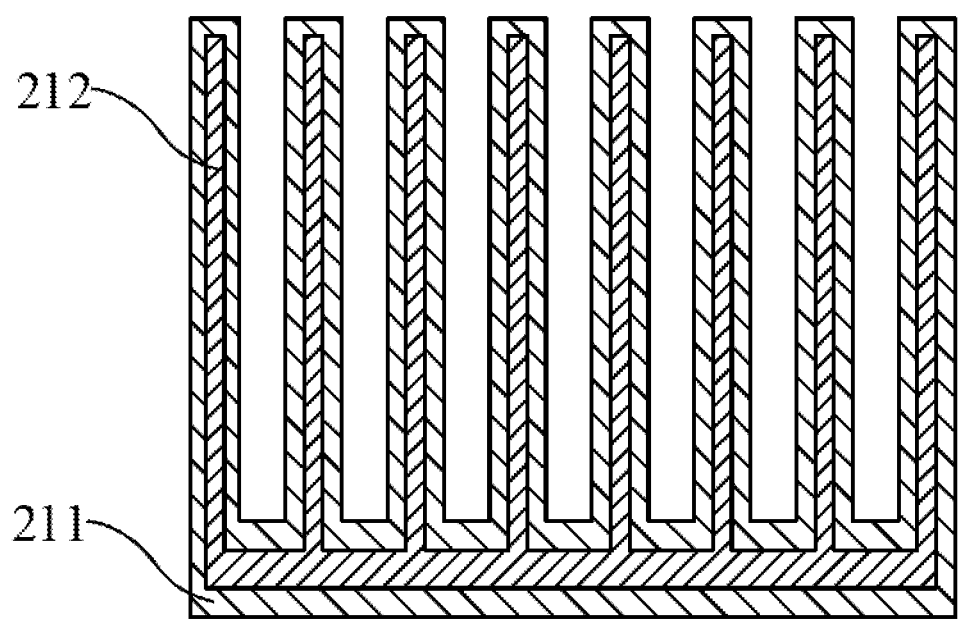
FIG. 2 is a schematic diagram of a radiator according to an embodiment of the present disclosure.

The temperature of an object is closely relative to the surface area of the object during cooling. The larger the surface area is, the faster the heat dissipates and the temperature drops. Referring to FIG. 2, in order to further accelerate the cooling process, a cooling fin 21 may be connected to the radiator 20. The cooling fin 21 may include a base portion 211 and multiple fin portions 212. The base portion 211 of the cooling fin 21 may be connected to the radiator 20. The fin portions 212 may be spaced apart and arranged on a side of the base portion 211 opposite to the radiator 20. Correspondingly, the base portion 211 may transfer the heat of the radiator 20 to the fin portions 212. Since the fin portions 212 are spaced apart, the gap between two adjacent fin portions 212 may form an air flow channel. Therefore, the surface air contact area of the cooling fin 21 may be increased and the cooling performance may be improved.

To further accelerate the cooling speed, heat pipes may be set on the cooling fin 21. For example, each of the fin portions 212 may define a hole, and a heat pipe may be inserted into each of the holes. The heat pipe may additionally increase the surface air contact area of the radiator 20 so as to accelerate the cooling speed. Alternatively to improve the cooling performance of the radiator 20, heat-conducting glue may be applied between the heat pipe and the wall of the holes. Since the thermal conductivity of the heat pipe is much higher than that of pure metal such as copper and aluminum, and its thermal conduction is isotropic, the heat pipe may help to transfer heat further. Thus, its implementation may obviously improve the cooling performance.

Apparently, other embodiments for increasing the cooling surface of the radiator 20 so as to accelerate the cooling speed may also be applied. These embodiments are similar to the principle of the present disclosure, thus they are also considered to be within the scope of the present disclosure.

Referring to FIG. 1, in this embodiment, the conductive adhering layer 30 may be set between the grounding layer 142 of the second core board 14 and the radiator 20. It is utilized to electrically connect the radiator 20 and the grounding layer 142 of the second core board 14.

The conductive adhering layer 30 may be an adhering layer having conductive and adhesive effect. The conductive adhering material may include a composition of conductive material and glue material. For example, the conductive material may be metal or graphite, and the glue material may be epoxy resin.

The conductive adhering layer 30 is disposed between the radiator 20 and the core board assembly 10, which forms a sandwich structure. On one hand, this configuration may achieve the electrical connection between the radiator 20 and the grounding layer 142 of the second core board 14 so as to ground the grounding layer 142 of the second core board 14. On the other hand, since the conductive adhering layer 30 is adhesive, the conductive adhering layer 30 may stick the radiator 20 on the grounding layer 142 closely to ensure the contact between the radiator 20 and the pounding layer 142 of the second core board 14. Moreover, the conductive adhering plate 30 is thermally conductive such that it can transfer the heat generated by heating components to the radiator 20 so as to accelerate the cooling of the heating components.

The conductive adhering layer 30 is utilized to realize the electrical connection between the radiator 20 and the grounding layer 142 of the second core board 14. Since the contact area of the conductive adhering layer 30 and the grounding layer 142 is larger than the contact area of the traditional grounding hole and the grounding layer 142, the conductive adhering layer 30 may provide a larger contact area such that the grounding stability of the grounding layer 142 may be improved.

In one embodiment, the conductive adhering layer 30 may be made of conductive adhering material. The conductive adhering material may be a paste or a liquid, or the conductive adhering material may have a semi-cured form. The term "semi-cured form" means that the material is solid in atmospheric temperature but may flow when heated, and finally it may be cured under a certain temperature.

The conductive adhering material may be firstly stuck on the radiator 20 or the grounding layer 142 of the second core board 14 by printing or coating. Then the radiator 20 may be placed in the slot 16. As the first core board 12 and the second core board 14 are compressed to form a sandwich structure, the radiator 20 and the grounding layer 142 of the second core board 14 may be stuck together.

In one embodiment, the conductive adhering material may be a conductive glue composed by a resin matrix, conductive particles, dispersion additives and other additives. The resin matrix may be an adhesive such as an epoxy resin, silicone resin, polyimide resin, phenolic resin, polyurethane, acrylic resin or the like. The adhesive may form the molecular skeleton of the conductive glue after being cured which may make the conductive glue to have sufficient mechanical prosperities and adhering prosperity, and make the conductive particles to form conductive channel. The conductive particles may be powder of gold, silver, copper, aluminum, zinc, iron, nickel and other conductive compound, and is utilized for conduct electricity.

Furthermore, the conductive adhering material may be conductive silver paste, conductive copper paste or conductive solder paste. Take the conductive silver paste as an example. When utilized, the conductive silver paste may be coated on the radiator 20 and the grounding layer 142 which is connected with the radiator 20. The portions of the radiator 20 and the grounding layer 142 coated with the conductive silver paste may be stuck together before the conductive silver paste is cured. Then by curing the conductive silver paste, the conductive adhering layer 30 may be formed such that the radiator 20 and the grounding layer 142 of the second core board 14 may be stuck together.

In another embodiment, the conductive adhering layer 30 may be a semi-cured adhering plate. During the manufacturing process, the semi-cured adhering plate may be stuck on the radiator 20 or the rounding layer 142 of the second core board 14. The radiator 20 is then disposed into the slot 16 of the core board assembly 10 with the attached semi-cured adhering plate facing inside. The radiator 20 may be stuck on the grounding layer 142 of the second core board 14 when the first core board 12 and the second core board 14 are compressed to form a sandwich structure. It should be understood, all the methods applying the conductive adhering layer 30 to indirectly and electrically connect the radiator 20 and the grounding layer 142 of the second core board 14 should be considered to be within the scope of the present disclosure.

In one embodiment, the conductive adhering layer 30 may be made of conductive foam. Conductive double-sided adhesive may be set on two opposite sides of the conductive foam. The conductive foam may be respectively attached to the radiator 20 and the grounding layer 142 through the double-sided adhesive on the two opposite sides such that the radiator 20 and the grounding layer 142 of the second core board 14 may be physically and electrically connected. The conductive foam has good electrical conductivity and a relative large elasticity such that it can effectively fill in the small gap between the radiator 20 and the grounding layer 142, and make the radiator 20 and the metal layer to well contact with each other. Therefore, bad grounding problems due to insufficient contact between the radiator 20 and the grounding layer 142 during manufacturing can be avoided.

Since epoxy resin may be cured at room temperature or a temperature below 150° C. and may include different chemical constituents, in another embodiment, silver may be added in the epoxy resin for manufacturing the adhering plate in solid state. Then the adhering plate can be utilized to attach and electrically connect the radiator 20 with the grounding layer 142 of the second core board 14.

Moreover, in order to glue together the outer wall of the radiator 20 and the inner wall of the first core board 12, a second connecting layer 19 may be arranged in the gap 17 between the outer wall of the radiator 20 and the inner wall of the slot 16 of the first core board 12. The second connecting layer 19 may also be made of thermosetting material which has not undergone heat treatment or thermoplastic material. When the core board assembly 10 is heated, the second connecting layer 19 may be melt and be evenly filled in the gap 17 such that the radiator 20 and the first core board 12 may be closely stuck together. Thus, drop risk may be reduced.

The material of the first connecting layer 18 may be either same as or different from that of the second connecting layer 19. In this embodiment, the material of the first connecting layer 18 may be same as that of the second connecting layer 19, and the first connecting layer 18 may be integrally formed with the second connecting layer 19.

Specifically, when there are multiple first core boards 12 and second core boards 14. The first connecting layer 18 may be utilized to glue together each two adjacent first core boards 12 and each two adjacent second core boards 14. When the sandwich structure is heated, the first connecting layer 18 may be melt and flow into the gap 17 between the outer wall of the radiator 20 and the inner wall of the slot 16. After the melt material is cooled, the second connecting layer 19 is formed in the gap 17 between the outer wall of the radiator 20 and the inner wall of the slot 16. By integrally forming the first connecting layer 18 and the second connecting layer 19, corresponding production processes may be simplified and production efficiency may be improved.

Due to the roughness of the surface of the radiator 20, the width of the gap 17 should be larger than 0.05 mm such that the radiator 20 may be successfully put into the slot 16. However, if the gap 17 is too large, more second connecting layer 19 should be filled in the gap 17, which lead to a waste of material. To solve this problem, in different embodiments, the size of the gap 17 may be 0.05-0.2 mm, such as 0.05 mm, 0.08 mm, 0.1 mm, 0.13 mm, 0.15 mm, 0.18 mm or 0.2 mm. In this way, the radiator 20 may be easily put into the slot 16, and the adhering material for ensuring the adhering strength may be saved which may reduce the cost.

In this embodiment, the first connecting layer 18 and the second connecting layer 19 are both formed by conductive adhering material in paste state or liquid state.

In order to ensure that the conductive adhering material in paste state or liquid state of the first connecting layer 18 between the first core board 12 and the second core board 14 may fill the whole gap 17 after being melt, the distance between the first core board 12 and the second core board 14 may be larger than the gap 17 between the outer wall of the radiator 20 and the inner wall of the slot 16. Generally, the size of the gap 17 may be 0.08 mm-0.15 mm.

Referring to FIG. 1, the cross-sectional area of the conductive adhering layer 30 may be smaller than or equal to the area of the surface of the radiator 20 which is in contact with the conductive adhering layer 30. In this way, the conductive adhering layer 30 will not flow into the gap 17 even if it is melt, which may avoid short-circuit between the radiator 20 and the metal layer of the first core board 12. The cross-sectional area of the conductive adhering layer 30 is the area of the cross section of the conductive adhering layer 30 parallel to the surface of the radiator 20 which is in contact with the conductive adhering layer 30.

Figure 3:
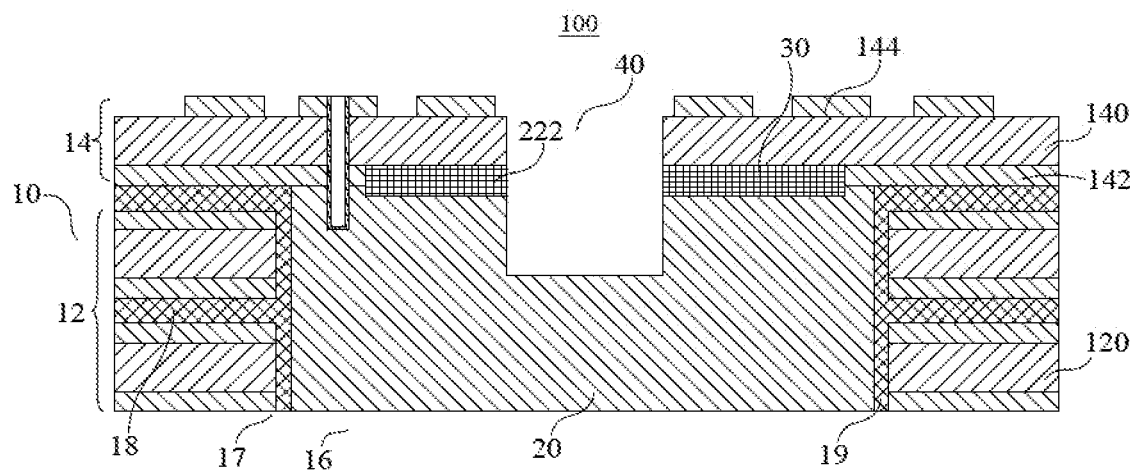
FIG. 3 is a section view of a printed circuit board according to an embodiment of the present disclosure.
Figure 4:
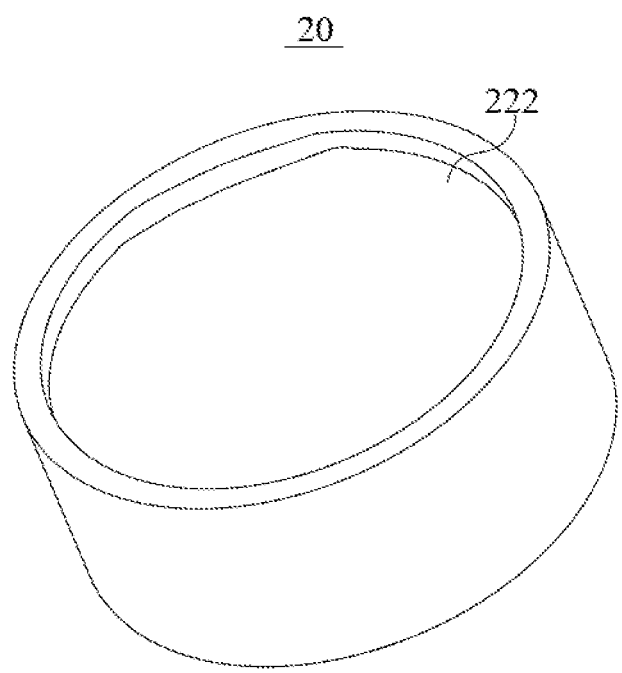
FIG. 4 is a perspective view of a radiator according to an embodiment of the present disclosure.

Referring to FIGS. 3 and 4, a groove 222 may be formed on the end surface of the radiator 20 which is in contact with the wounding layer 142. In this circumstance, during the compressing process of the first core board 12 and the second core board 14, the conductive adhering layer 30 may fill into the groove 222 after being melt because of the restriction of the groove 222. Thus, the conductive adhering layer 30 will not over flow or flow into the gap between the outer wall of the radiator 20 and the inner wall of the slot 16, which may avoid short-circuit between the radiator 20 and the metal layer of the first core board 12.

Specifically, the groove 222 is a concave structure formed in the surface of the radiator 20 which is in contact with the grounding layer 142. Its depth direction is opposite to the grounding layer 142 along the stacking direction of the first core board 12 and the second core board 14.

As shown in FIG. 3, the cross-section of the groove 222 taken along a direction perpendicular to the first core board 12 is rectangular. The opening width of the groove 222 may be less than the width of the cross-section of the radiator 20.

Specifically, in the direction perpendicular to the first core board 12, the distance between the side wall of the groove 222 and the outer wall of the radiator 20 may be larger than or equal to a predetermined distance. In this way, the contact area between the conductive adhering layer 30 and the radiator 20 and the contract area between the conductive adhering layer 30 and the grounding layer 142 may be maximized, which may improve connection stability.

The predetermined distance may be based on processing precision and strength of the side wall of the groove. It can be determined flexibly and is not limited in the present disclosure.

Figure 5:
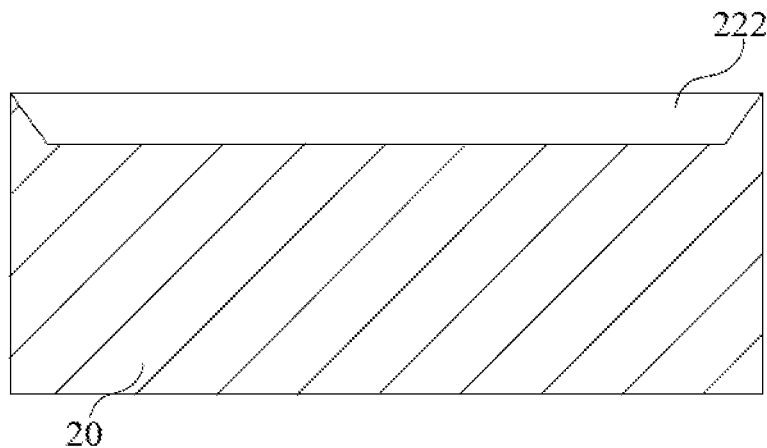
FIG. 5 is a section view of a radiator according to an embodiment of the present disclosure.
Figure 6:
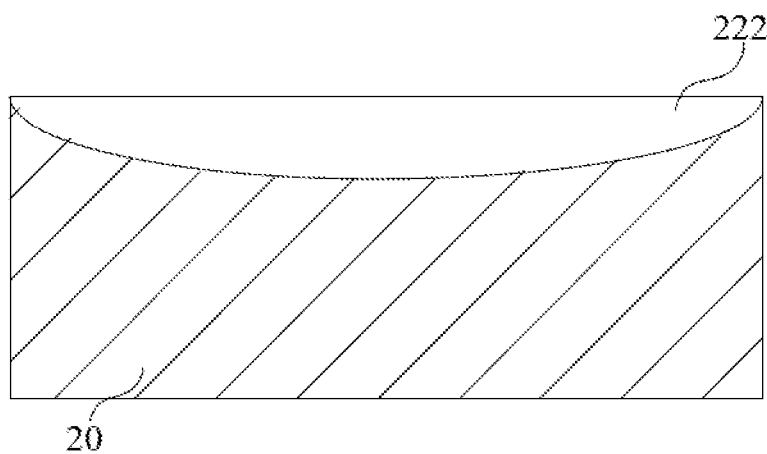
FIG. 6 is a section view of the radiator of FIG. 5 taken from another direction.

In some embodiments, the opening width of the groove 222 may be equal to the width of the cross-section of the radiator 20, as shown in FIGS. 5 and 6. In this circumstance, the contact area between the conductive adhering layer 30 and the grounding layer 142 may be further enlarged, which further improves the connection stability.

Specifically, at the position close to the outer wall of the radiator 20, there exists an angle between the side wall of the groove 222 and the outer wall of the radiator 20, and the angle is less than 90 degrees. That is, along the direction perpendicular to the first core board 12, the cross-section of the groove 222 may be an arc or a reverse trapezium. For example, in the embodiment shown in FIG. 5, the cross-section of the groove 222 may be a reverse trapezium, and in the embodiment shown in FIG. 6, the cross-section of the groove may be an arc.

As shown in FIG. 1, the printed circuit board 100 may further define an installation slot 40 extending through the second core board 14. The installation slot 40 may be utilized for installing a heating component 200 (shown in FIG. 7). In this embodiment, the installation slot 40 may be disposed corresponding to the location of the radiator 20.

The installation slot 40 may extend through the conductive adhering layer 30 and up to the surface of the radiator 20 or into the radiator 20. When the first signal layer 144 is disposed on a side of the second core board 14 opposite to the first core board 12, the installation slot 40 may extend from the first signal layer 144 of the second core board 14 to the surface of the radiator 20 or into the radiator 20.

The installation slot 40 extending into the radiator 20 means that the depth of the installation slot 40 is larger than the thickness of the second core board 14 and smaller than the thickness of the printed circuit board 100. Furthermore, the installation slot 40 may correspond to only part of the conductive adhering layer 30 such that the radiator 20 and the grounding layer 142 of the second core board 14 may be connected through the rest of the conductive adhering layer 30.

In this embodiment, the installation slot 40 with a predetermined depth may be milled on the second core board 14 by controlled deep milling process. The installation slot 40 with a predetermined depth may be processed with only one controlled deep milling process. The method involves less processes, and during the process the benchmark only needs to be determined for one time. Thus, the method may improve the machining precision.

As shown in FIG. 1, the printed circuit board 100 may further define a via hole 50. In this embodiment, the via hole 50 may extend through the second core board 14, and extend from the first signal layer 144 of the second core board 14 through the conductive adhering layer 30 and into the radiator 20. Moreover, a conductive layer 52 may be disposed in the via hole 50 for electrically connecting the first signal layer 144 of the second core board 14 and the grounding layer 142 of the second core board 14.

In the case that the core board assembly 10 further includes a third core board, the via hole 50 may extend from the second signal layer of the third core board through the second core board 14 and into the radiator 20. Moreover, a conductive layer 52 may be disposed in the via hole 50 for electrically connecting the second signal layer of the third core board and the grounding layer 142 of the second core board 14.

Specifically, the conductive layer 52 in the via hole 50 may extend from the first signal layer 144 of the second core board 14 or the second signal layer of the third core board up to the radiator 20 so as to directly connect the grounding layer 142 of the second core board 14 or the second signal layer of the third core board with the radiator 20 and strengthen the grounding performance of the first signal layer 144 or the second signal layer.

In another embodiment, the via hole 50 may extend from the first signal layer 144 of the second core board 14 or the second signal layer of the third core board to the conductive adhering layer 30 but not extend through the conductive adhering layer 30 nor the radiator 20. In yet another embodiment, when the maximal cross-sectional area of the conductive adhering layer 30 is less than the area of the surface of the radiator 20 which is in contact with the conducting adhering layer 30, the via hole 50 may be spaced from the fringe of the conductive adhering layer 30 such that the via hole 50 may extend to the radiator 20 without extending through the conductive adhering layer 30. The metal material of the conductive layer 52 may include but is not limited to titanium, palladium, zinc, cadmium, gold or brass, bronze, etc. It may alternatively be a diffusion layer, such as nickel-silicon carbide, nickel-fluorinated graphite, etc. It may also be a compound layer, such as a copper-nickel-chromium layer, Silver-indium layer. It is not limited in the present disclosure.

Moreover, as shown in FIG. 1, a metal cover 60 may be set on the side of the first core board 12 away from the second core board 14. The metal cover 50 may cover the opening of the slot 16 (as shown in FIG. 1).

Specifically, the metal cover 60 may be set on the side of the first core board 12 away from the second core board 14. The metal cover 60 may seal the radiator 20 in the slot 16 and prevent the radiator 20 from dropping. Furthermore, the metal cover 60 may enlarge the cooling surface of the radiator 20 so as to improve its cooling performance. The metal cover 60 may further prevent the second connecting layer 19 in the molten state form leaking from the gap 17.

The metal cover 60 may be formed by electroplating or coating appropriate metal material, which is not limited in the present disclosure.

Figure 7:
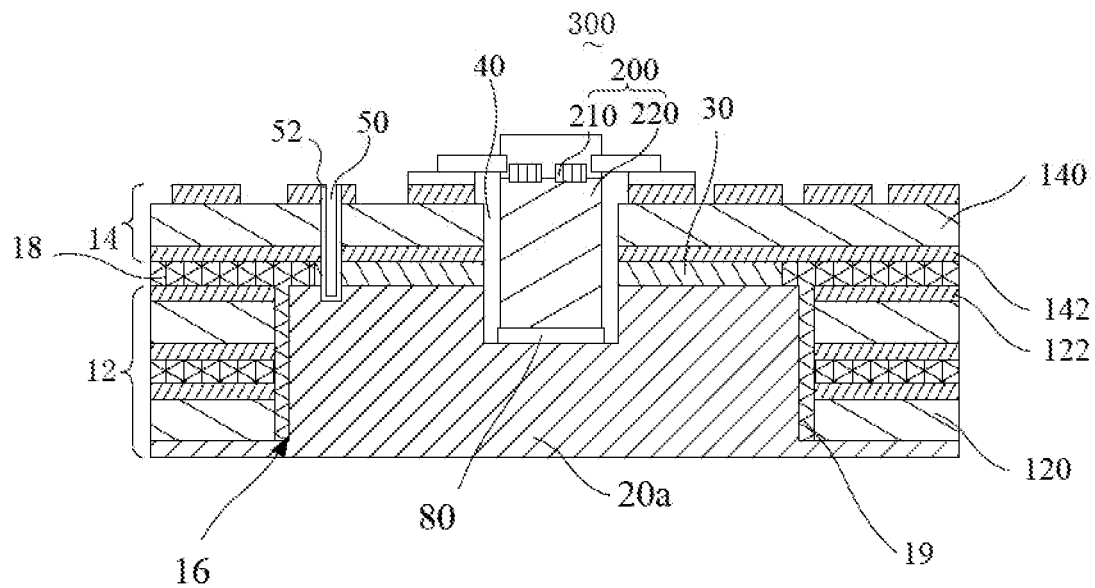
FIG. 7 is a schematic diagram of an electronic device according to an embodiment of the present disclosure.

Referring to FIG. 7, the present disclosure provides an electronic device 300. The electronic device 300 may include a printed circuit board 100 and a heating component 200.

The printed circuit board 100 of this embodiment may include a core board assembly 10, a first radiator 20*a* and a conductive adhering layer 30.

Since the printed circuit board 100 of this embodiment may have a similar structure as the printed circuit board 100 of the foregoing embodiments, in this embodiment, the different structure of the printed circuit board 100 will be described while the same structure will not. Besides, the first radiator 20*a* of this embodiment may have a similar structure as the radiator 20 of the foregoing embodiments, thus its structure will not be described in detail hereinafter. For detailed information, the radiator 20 of the foregoing embodiments may be referred.

The heating component 200 may be installed in the installation slot 40 of the printed circuit board 100, and the maximal cross-sectional area of the heating component 200 may be less than the cross-sectional surface of the installation slot 40. The maximal cross-sectional area of the heating component 200 is the maximal area of the cross sections of the heating component 200 parallel to the first core board 12 and the second core board 14.

The heating component 200 may be or may include a component which may generate heat, e.g., electrical element, application processor or IC chip etc. The heating component 200 may be installed in the installation slot 40. The heating component 200 may be connected with the first radiator 20*a* through conductive soldering material layer 80 (for example, tin paste, tin plate or copper paste). Thermal-conductive resin 80 may transfer heat from the heating component 200 to the first radiator 20*a* so as to cool the heating component 200.

In one embodiment, the heating component 200 is a component that generates heat. By directly connecting the heating component 200 with the first radiator 20*a*, the surface area for cooling may be increased such that the cooling performance of the printed circuit board 100 may be improved.

As shown in FIG. 7, in yet another embodiment, the heating component 200 may include an electronic component 210 and a second radiator 220.

The electronic component 210 may be an integrated circuit either packaged or not (a device not packaged means without metal base, plastic package adhesive or ceramic shell), triode, insulated gate bipolar transistor (IGBT), metal oxide semiconductor (MOS) or tiled effect transistor etc.

The second radiator 220 may be disposed in the installation slot 40, and between the first radiator 20a and the electronic component 210. The second radiator 220 is utilized to transfer heat generated by the electronic component 210 to the first radiator 20a, and then the heat may dissipate from the first radiator 20a. Accordingly, the arrangement of the second radiator 220 between the electronic component 210 and the first radiator 20a may rapidly transfer the heat of the electronic component 210 to the first radiator 20a such that the cooling performance of the printed circuit board 100 may be improved. The cross-sectional area of the second radiator 220 may be less than the cross sectional area of the installation slot 40. Similarly, the maximal cross-sectional area of the second radiator 220 is the maximal area of the cross sections of the second radiator 220 parallel to the first core board 12 and the second core board 14.

In this embodiment, the second radiator 220 may be a metal block. The metal included in the metal block 20 may include but is not limited to copper, copper alloy, aluminum, aluminum alloy, iron, iron alloy, nickel alloy, gold, gold alloy, silver, silver alloy, platinum, platinum alloy, chromium, chromium alloy, magnesium, magnesium alloy, tungsten, tungsten alloy, molybdenum, molybdenum alloy, lead, lead alloy, tin, tin alloy, indium, indium alloy, zinc and zinc alloy etc.

In another embodiment, the metal block may be made of a metal matrix and a conductive graphite plate. The thermo resistance of the conductive graphite plate is smaller than that of conventional metal and alloy. Thus embedding the conductive graphite plate in the metal may improve the thermal conduction. The material of the second radiator 220 is not limited in the present disclosure.

The second radiator 220 may have a regular shape such as cube or cylinder, or have an irregular shape. The structure of the second radiator 220 is not limited in the present disclosure.

There may be various methods for connecting the second radiator 220 with the first radiator 20a. For example, conducting resin may be applied to glue together the second radiator 220 and the first radiator 20a. Alternatively, the second radiator 220 and the first radiator 20a may be welded together. Alternatively, conductive soldering material layer 80 (tin paste, tin plate or copper paste) may be utilized for connecting the second radiator 220 and the first radiator 20a. It should be understood that other methods for electrically connecting the second radiator 220 and the first radiator 20a should also be considered to fall in the scope of the present disclosure.

In this embodiment, the second radiator 220 may be electrically connected with the first radiator 20a. The rounding layer 142 may be electrically connected with the first radiator 20a. Thus the electronic component 210 may be grounded through the first radiator 20a, which may provide better grounding stability.

Referring to FIGS. 8-14, FIGS. 8-10 are flow charts of methods for manufacturing the printed circuit board according to an embodiment of the present disclosure. FIGS. 11-15 show the manufacturing processes of the printed circuit board according to an embodiment of the present disclosure.

The method for manufacturing the printed circuit board 100 may include the following blocks.

S10: Providing a first core board 12, a second core board 14, a radiator 20 and conductive adhering material 30, wherein the second core board 14 may include a metal layer disposed on a side of the second core board 14 adjacent to the first core board 12.

There may be at least one first core board 12 and at least one second core board 14. The first core board 12 may include a substrate 120 and a metal layer which is located on at least one side of the substrate 120. Similarly, the second core board 14 may include a substrate 140 and a metal layer which is located on at least one side of the substrate 140.

In this embodiment, the metal layer may be set on the side of the first core board 12 towards the second core board 14.

In other words, each of the second core board 14 may include a substrate 140. The metal layer may be disposed on only one side, or on both two opposite sides of the substrate 140. However, the metal layer should be disposed on at least the side of the second core board 14 towards the radiator 20.

In this embodiment, referring to FIG. 1, the metal layer may be arranged on both sides of the substrate 140 of the second core board 14. The metal layer located on one side of the second core board 14 towards the first core board 12 may be the grounding layer 142, while the metal layer located on the other side which is opposite to the first core board 12 may be the first signal layer 144. Surface treatments should be applied to each of the first core board 12 and the second core board 14. The surface treatments may include: electroplating the surface of each of the first core board 12 and the second core board 14 according to a pre-determined pattern so as to form the pattern on the surface.

In practice, commonly a portion of the metal layer on the surface of each of the first core board 12 and the second core board 14 may be plated with tin. Then the portion where tin is not plated can be dissolved away by chemical methods. Specifically, chemical reagents can be employed to process each of the first core boards 12 and the second core boards 14. The chemical reagents may react with the portion of the metal layer which is not plated, but may not react with the plating material, such that the portion of the metal layer which is not plated may be dissolved away. Then the tin on each of the chemically treated first core board 12 and second core board 14 may be removed such that the metal layer corresponding to plating pattern may be acquire and the metal pattern may be formed.

After the pattern is formed on the first core board 12 and the second core board 14, the following blocks may be executed.

S20: Slotting the first core board 12 to form a first through slot 124 extending through the first core board 12.

Specifically, block S20 may include the following sub-blocks.

S210: Providing a first connecting layer 18 which is adhesive.

S220: Slotting the first core board 12 and the first connecting layer 18 so as to form the first through slot 124 on the first core board 12, and to form the second through slot 182 on the first connecting layer 18.

S230: Placing the first connecting layer 18 between the first core board 12 and the second core board 14 and aligning the first through slot 124 with the second through slot 182. The maximal cross-sectional areas of the first through slot 124 and the second through slot 182 should be larger than the maximal cross-sectional area of the radiator 20 for allowing the radiator 20 to be disposed in the first through slot 124 and the second through slot 182.

In this embodiment, the first connecting layer 18 may be made of thermoplastic material. In one embodiment, the thermoplastic material may include polyketone, polyaramid, polyimide, polyetherimide, polyamideimide, polyphenylene sulfide, polyphenylsulfone, fluoropolymer, polybenzimidazole, derivatives thereof or combination thereof. In another embodiment, the thermoplastic material may include one polymer such as polyketone, thermoplastic polyimide, polyetherimide, polyphenylene sulfide, polyether sulfone, polysulfone, polyamide imide, derivatives thereof, or combinations thereof. In yet another embodiment, the thermoplastic material may include polyetone such as polyether ether ketones, polyether ketones, polyether ketone ketones, polyether ether ketone ketones, derivatives thereof, or combinations thereof.

The first connecting layer 18 may alternatively be thermosetting material. In one embodiment, the thermosetting material may include allyl resin, epoxy resin, thermosetting polyurethane, silicone or polysiloxane etc. These resins may be formed from the reaction product of a polymerizable composition that includes at least one oligomeric polyurethane (meth) acrylate. In general, the oligomeric polyurethane (meth) acrylate is a poly (meth) acrylate. The term "(meth) acrylate" may refer to the esters of acrylic acid and methacrylic acid. Compared to "multi-(meth)-acrylates," which generally refer to (meth) acrylate polymers, "multi-(meth)-acrylate" refers to a molecule that includes more than one (meth) acrylate group. Usually, the multi-(meth)-acrylate may be a di-(meth)-acrylate, but tri-(meth)-acrylates, tetra-(meth)-acrylates, and the like are also contemplated.

In other embodiments, in the case that there are multiple first core boards 12 and multiple second core boards 14, the slotting the first core board 12 may specifically include the following sub-blocks.

S210a: Providing multiple first connecting layers 18 which are adhesive.

S220a: Slotting the first core boards 12 and the first connecting layers 18 so as to form the first through slot 124 on each of the first core boards 12 and to form the second through slot 182 on each of the first connecting layers 18.

S230a: Placing the first connecting layer 18 between each two adjacent first core boards 12, between each two adjacent second core boards 14, and between the first core board 12 and the second core board 14 adjacent to each other, and aligning the second through slots 182 of the first connecting layers 18 with the first through slots of the first core boards 12.

Specifically, the first core boards 12 and the second core boards 14 may be vertically and successively disposed together. The first connecting layer 18 may be arranged between each two adjacent first core boards 12, between each two adjacent second core boards 14 and between the first core boards 12 and the second core boards 14 adjacent to each other. For example, when there are two first core boards 12 and two second core boards 14. The order in which the elements are stacked may be as follows: one of the first core boards 12, the first correcting layer 18, the other one of the first core boards 12, the first connecting layer 18, one of the second core boards 12, the first connecting layer 18 and the other one of the second core boards 14.

S30: Placing the radiator 20 in the first through slot 124.

In one embodiment, the conductive adhering material 30 may be a conductive adhering material in paste state or liquid state. When the conductive adhering material 30 is a conductive adhering material in paste state or liquid state, the step of connecting the radiator 20 with the grounding layer 142 of the second core board 14 through the conductive adhering material 30 may include: attaching the conductive material on the radiator 20 or the grounding layer 142 of the second core board 14 by printing or coating and placing the radiator 20 in the through slot so as to connect the radiator 20 with the metal layer 142 of the second core board 14.

The conductive adhering material may be a conductive glue composed by a resin matrix, conductive particles, dispersion additives and other additives. The resin matrix may be an adhesive such as epoxy resin, silicone resin, polyimide resin, phenolic resin, polyurethane, acrylic resin or the like. The adhesive may form the molecular skeleton of the conductive glue after being cured which may make the conductive glue to have sufficient mechanical prosperities and adhering prosperity, and make the conductive particles to form conductive channel. The conductive particles may be powder of gold, silver, copper, aluminum, zinc, iron, nickel and other conductive compound, and is utilized for conduct electricity. The conductive adhering material in liquid state may be conductive silver paste, conductive copper paste or conductive solder paste.

In another embodiment, the conductive adhering layer 30 may be a semi-cured adhering plate. The step of connecting the radiator 20 with the metal layer 142 of the second core board 14 through the conductive adhering layer 30 may include: attaching the conductive adhering layer 30 on the radiator 20 and disposing the radiator 20 into the slot so as to connect the radiator 20 with the metal layer 142 of the second core board 14.

In one embodiment, the conductive adhering layer 30 may be made of conductive foam. Conductive double-sided adhesive may be set on two opposite sides of the conductive foam. The conductive foam may be respectively attached to the radiator and the metal layer through the double-sided adhesive on the two opposite sides such that the radiator and the metal layer of the second core board may be physically and electrically connected. The conductive foam has good electrical conductivity and a relative large elasticity such that it can effectively fill in the small gap between the radiator and the metal layer and make the radiator and the metal layer to well contact each other. Therefore, bad grounding problems due to insufficient contact between the radiator and the metal layer during manufacturing can be avoided.

Since epoxy resin may be cured at room temperature or a temperature below 150° C. and may include different chemical constituents, in another embodiment, silver may be added in the epoxy resin for manufacturing the adhering plate in solid state. Then the adhering plate can be utilized to attach and electrically connect the radiator 20 with the grounding layer 142 of the second core board 14. By adding silver in the epoxy resin, the above-mentioned adhering plate with a thickness of 0.05-0.5 mm and a volume resistance below 0.4 mΩ may be easily acquired.

After the radiator 20 and the grounding layer 142 of the second core board 14 are connected and the first connecting layer 18 is disposed, the following blocks may be executed.

S40: Compressing the first core board 12, the second core board 14 to form the printed circuit board 100 so as to connect the radiator 20 with the metal layer 142 through the conductive adhering layer 30. Specifically, the step S40 may include:

heating the first core board 12, the second core board 14 and the first connecting layer 18 such that the first connecting layer 18 may be melt and then filled between the first core board and the second core board, and between the radiator and the inner wall of the first through slot 124 (or the second through slot 182);

compressing be first core board 12, the second core board 14 and the first connecting layer 18 so as to form the printed circuit board 100.

Specifically, the first core board 12, the second core board 14 and the first connecting layer 18 may be heated and compressed. Since the first connecting layer 18 is made of thermosetting material or thermoplastic material, when heated, the first connecting layer 18 may be softened and become liquid. Since the cross-sectional areas of the first through slot 124 and the second through slot 182 are greater than the maximal cross-sectional area of the radiator 20, a gap 17 may exist between the inner wall of the second through slot 182 and the outer wall of the radiator 20. The liquid thermosetting material may flow into the gap 17 and fully fill the gap 17 between the inner wall of the second through slot 182 and the outer wall of the radiator 20. Then the heating may be stopped, and the liquid thermosetting material is cooled, hardened, and left in the gap 17.

After the printed circuit board 100 is formed, in order to provide an installation space for installing a heating component 200 on the printed circuit board 100, an installation slot 40 may be formed on the printed circuit board 100. The installation slot 40 may be disposed corresponding to the location of the radiator 20, and may extend into the radiator 20. The cross-sectional area of the installation slot may be smaller than the cross-sectional area of the conductive adhering layer 30. In the case that the first signal layer 144 is set on a side of the second core board 14 opposite to the first core board 12, the installation slot 40 may extend from the first signal layer 144 of the second core board 14 into the radiator 20.

The installation slot 40 extending into the radiator 20 means that the depth of the installation slot 40 is larger than the thickness of the second core board 14 and smaller than the thickness of the printed circuit board 100. The cross-sectional area of the installation slot 40 may be smaller than the cross-sectional area of the conductive adhering layer 30 such that the radiator 20 and the grounding layer 142 of the second core board 14 may be connected through the rest of the conductive adhering layer 30.

In this embodiment, the installation slot 40 with a predetermined depth may be milled on the second core board 14 by controlled deep milling process. The installation slot 40 with a predetermined depth may be processed with only one controlled deep milling process. The method involves less processes, and during the process the benchmark only needs to be determined for one time. Thus, the method may improve the machining precision.

After the installation slot 40 is formed, a via hole 50 may be formed on the printed circuit board 100. The via hole 50 may extend from the first signal layer 144 of the second core board 14 through the conductive adhering layer 30 and into the radiator 20.

In other embodiments, in the case that the core board assembly includes a third core board, the via hole 50 may extend from the second signal layer of the third core board through the second core board 14 and into the radiator 20.

Specifically, the via hole may extend up to the radiator 20 so as to improve the grounding performance of the signal layer 144 of the second core board 14 or the second signal layer of the third core board.

In other embodiments, the via hole 50 may extend from the first signal layer 144 of the second core board 14 (or the second signal layer of the third core board) up to the conductive layer 30, which means it does not pass through the conductive layer 30 and the radiator 20.

In other embodiments, when the maximal cross-section of the conductive adhering layer 30 is smaller than the surface of the radiator 20 which is in contact with the conductive adhering layer, the via hole 50 may extend from the first signal layer 144 of the second core board 14 (or the second signal layer of the third core board) up to the radiator 20 and bypass the conductive adhering layer 30.

The via hole 50 and the installation slot 40 may be metalized such that a conductive layer 52 may be formed on the inner wall of the via hole 50 and the side wall of the installation slot 40. The conductive layer 52 on the inner wall of the via hole 50 may be utilized for electrically connecting a portion of the first signal layer 144 of the second core board 14 and the grounding layer 142 of the second core board 14.

In this embodiment, the via hole 50 and the installation slot 40 may be metalized by electroplating. Specifically, in a metal salt solution containing the metal iron for plating, the via hole 50 and the installation slot 40 may be taken as the negative electrode. Positive ions of the metal for plating may be deposited in the inner surface of the via hole 50 and the installation slot 40 by electrolysis so as to form the conductive layer 52. Common metals for electro plating may include but is not limited to titanium, palladium, zinc, cadmium, gold or brass, bronze, etc. It is to be understood, in other embodiments, the via hole 50 and the installation slot 40 may be metalized by other ways such as coating.

By using electroplating, the conductive layer 52 of the installation slot 40 may be electrically connected not only with the grounding layer 142 but also with the first signal layer 144. Thus, normally it is possible to remove the conductive layer 52 between the first signal layer 144 of the second core board 14 and the grounding layer 142 by machining. Traditional machining precision may achieve ±4 mil (1 mil=0.0254 mm), i.e., 0.1016 mm. According to design requirement of the PCB, the thickness of the substrate 140 of the second core board 14 located between the first signal layer 144 and the grounding layer 142 may be 0.1 mm. That is to say, traditional machining precision cannot satisfy the design requirement. If the conductive layer 52 is cut too deep, the grounding layer 142 and the conductive layer 52 may be totally separated, and the electrical connection between the conductive layer 52 and the grounding layer 142 may be broken. If the conductive layer 52 is cut to shallow, a lot of cooper material may be left between the first signal layer 144 and the grounding layer 142. This may lead to high return loss and degrade the performance of the PCB 100.

In this embodiment, laser cutting may be employed to remove the portion of the conductive layer 52 between the grounding layer 142 and the first signal layer 144 so as to acquire the conductive layer 52 which electrically connects the radiator 20 and the grounding layer 142.

Specifically, in this embodiment, the conductive layer 52 may be made of cooper. Laser pulse with a pulse energy higher than the necessary energy threshold for melting or vaporizing cooper foils may be applied on the end surface of the cooper layer away from the radiator 20 so as to melt or vaporize the cooper foils. Thus, the cooper layer between the first signal layer 144 and the grounding layer 142 may be removed while the conductive layer 52 below the grounding layer 142 may be kept.

In this embodiment, ultraviolet rays may be utilized for laser cutting. During processing, the scanning speed of the UV light may be from 50 to 400 mm/s, The energy density of the UV light may be from 70 to 240 $J/cm^2$, and its frequency may be from 10-30 kHz. In other embodiments, other lasers may be utilized for cutting, which is not limited in the present disclosure.

The embodiments related to the method for manufacturing the printed circuit board 100 and the structure of the printed circuit board 100 are described in the present disclosure. The method and the printed circuit board 100 are not limited to the specific embodiment described above. The components of the printed circuit board 100 and/or the processes of the method may be utilized independently or with other components and/or processes. The components and/or processes may also be utilized in other systems, methods and/or devices, or with other systems, methods and/or devices. The implementation of these components and processes are not limited in the descripted embodiments of the printed circuit board 100 in the present disclosure.

Unless otherwise specified, the order of execution or operations of the embodiments of the present disclosure described in this specification is not an essential order. That is, the operations may be performed in any order, unless otherwise specified, and embodiments of the disclosure may include additional operations, or include fewer operations than those disclosed in this specification. For example, it is contemplated that performing a particular operation before, concurrently with, or after another operation is within the scope of various aspects of the present invention.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. A printed circuit board (PCB), comprising:
a core board assembly comprising a first core board and a second core board which are stacked together in series, wherein the second core board comprises a metal layer formed on a side of the second core board adjacent to the first core board, and the first core board defines a through slot extending through the first core board;
a radiator, at least partially disposed in the through slot; and
a conductive adhering layer, disposed between the metal layer of the second core board and the radiator, wherein the conductive adhering layer is configured to electrically connect the radiator and the metal layer;
wherein the core board assembly further defines an installation slot extending through the second core board and configured to receive a heating component;
the installation slot is arranged corresponding to a location of the radiator, the installation slot extends through the conductive adhering layer and to the radiator.

2. The PCB of claim 1, wherein
the first core board comprises a plurality of sub-boards stacked in series, and the through slot extends through the plurality of sub-boards.

3. The PCB of claim 1, further comprising
a first connecting layer arranged between the first core board and the second core board and surrounding the conductive adhering layer, wherein the first connecting layer comprises adhesive material and is configured to stick the first core board on the second core board.

4. The PCB of claim 3, wherein
a cross-sectional area of the through slot is greater than a cross-sectional area of the radiator such that a gap is formed between an outer wall of the radiator and an inner wall of the through slot.

5. The PCB of claim 4, wherein a size of the gap is from 0.05 to 0.2 mm.

6. The PCB of claim 4, further comprising a second connecting layer arranged in the gap, wherein the second connecting layer comprises adhesive material and is configured to stick the radiator on the first core board.

7. The PCB of claim 6, wherein the second connecting layer and the first connecting layer are an integration structure.

8. The PCB of claim 1, wherein a cross-sectional area of the conductive adhering layer is smaller than or equal to an area of a surface of the radiator being in contact with the conductive adhering layer.

9. The PCB of claim 8, wherein the surface of the radiator being in contact with the conductive adhering layer defines a groove, and the conductive adhering layer is located corresponding to the groove.

10. The PCB of claim 9, wherein a shape of a cross-section of the groove taken along a direction perpendicular to the stacking direction of the first core board and the second core board is a rectangle, an arc or a reverse trapezium.

11. The PCB of claim 1, wherein
the metal layer is a grounding layer;
the second core board further comprises a first signal layer on a side far away from the first core board;
the PCB further defines a via hole extending at least from the first signal layer to the grounding layer, a conductive layer for electrically connecting the first signal layer and the grounding layer is disposed in the via hole.

12. The PCB of claim 11, wherein the via hole extends through the conductive adhering layer and into the radiator.

13. The PCB of claim 11, wherein the via hole extends up to the conductive adhering layer, and does not pass through the conductive adhering layer and the radiator.

14. The PCB of claim 11, wherein the via hole extends into the radiator and bypasses the conductive adhering layer.

15. The PCB of claim 1, wherein the first core board further comprises a metal cover arranged opposite to the second core board, the metal cover covers the through slot.

16. The PCB of claim 1, further comprising:
a third core board stacked on a side of the second core board far away from the first core board; wherein
the third core board comprises a second signal layer on a side far away from the second core board;
the PCB further defines a via hole extending at least from the second signal layer to the grounding layer, a conductive layer for electrically connecting the second signal layer and the grounding layer is disposed in the via hole.

17. An electronic device, comprising:
a core board assembly comprising a first core board and a second core board successively disposed together, wherein the second core board comprises a grounding layer formed on a side of the second core board towards the first core board, and the first core board defines a through slot;
a radiator disposed in the through slot;
a conductive adhering layer disposed between the grounding layer and the first radiator and configured to stick the radiator on the metal layer; and
a heating component;
wherein the core board assembly further defines an installation slot, wherein the installation slot extends through the second core board, and the heating component is installed in the installation slot to be in contact with the conductive adhering layer; or the installation slot extends through the second core board and the conductive adhering layer, and the heating component is installed in the installation slot to be in contact with the radiator.

18. The electronic device of claim 17, wherein
the heating component comprises an electronic component and a second radiator, the second radiator is located in the installation slot and between the first radiator and the electronic component, the second radiator is made of conductive material;
the electronic device further comprises a conductive soldering material layer, and the second radiator is electrically connected with the first radiator through the conductive soldering material layer.

19. A method for manufacturing a printed circuit board (PCB), comprising:
providing a first core board, a second core board, a radiator and conductive adhering material, wherein the second core board comprises a metal layer disposed on a side of the second core board;
slotting the first core board to from a first through slot extending through the first core board;
covering at least a portion of a surface of the radiator or a portion of a surface of the metal layer with the conductive adhering material;
placing the radiator in the first through slot so as to stick the radiator on the metal layer; and
compressing the first core board, the second core board, the radiator and the conductive adhering material to form the PCB;
after the compressing the first core board, the second core board, the radiator and the conductive adhering material to form the PCB, forming on the core board assembly an installation slot extending through the second core board and corresponding to a location of the radiator;
wherein the installation slot extends through the conductive adhering material and up to a surface of the radiator or into the radiator.

20. The method of claim 19, wherein
the conductive adhering material is a paste or a thick liquid;
the covering at least a portion of a surface of the radiator or a portion of a surface of the metal layer with the conductive adhering material comprises: sticking the conductive adhering material on the metal layer or the radiator by printing or coating.

21. The method of claim 19, wherein
the conductive adhering material is semi-solid;
the covering at least a portion of a surface of the radiator or a portion of a surface of the metal layer with the conductive adhering material comprises: attaching the conductive adhering layer on the radiator.

22. The method of claim 19, further comprising before placing the radiator in the first through slot:
providing a first connecting layer being adhesive;
slotting the first connecting layer so as to form a second through slot;
disposing the first connecting layer between the first core board and the second core board and aligning the first through slot with the second through slot;
wherein the placing the radiator in the first through slot comprises placing the radiator in the first through slot and the second through slot.

23. The method of claim 22, further comprising, before compressing the first core board, the second core board, the radiator and the conductive adhering material to form the PCB:
heating the first core board, the second core board and the first connecting layer to melt the first connecting layer; and
making the first connecting layer to fill between the first core board and the second core board, and in the first through hole and the second through hole.

24. The method of claim 19, further comprising:
after the forming the installation slot, electroplating the installation slot to form a conductive layer on a side wall and a bottom wall of the installation slot; and
removing a portion of the conductive layer located above the second core board by using laser.

25. The method of claim 24, wherein the laser is a ultra violet light.

26. The method of claim 19, wherein
the second core board comprises a signal layer on a side far away from the first core board;
the metal layer disposed on the side of the second core board towards the first core board is a grounding layer;
the method further comprising: after the compressing the first core board, the second core board, the radiator and the conductive adhering material to form the PCB, forming on the PCB a via hole extending at least from the signal layer to the metal layer, and metalizing the via hole to attaching on an inner wall of the via hole a conductive layer being configured for electrically connecting the signal layer and the grounding layer.

27. The method of claim 19, further comprises, before the compressing the first core board, the second core board, the radiator and the conductive adhering material to form the PCB:
providing a third core board, wherein the third core board comprises a signal layer;
placing the third core board on a side of the second core board far away from the first core board;
wherein the compressing the first core board, the second core board, the radiator and the conductive adhering material to form the PCB comprises: compressing the first core board, the second core board, the third core board, the radiator and the conductive adhering material to form the PCB;
and after the compressing the first core board, the second core board, the third core board, the radiator and the conductive adhering material to form the PCB:
forming on the PCB a via hole extending at least from the signal layer to the metal layer; and
metalizing the via hole to attaching on an inner wall of the via hole a conductive layer being configured for electrically connecting the signal layer and the grounding layer.

* * * * *